United States Patent
Choi et al.

(10) Patent No.: US 9,664,960 B2
(45) Date of Patent: May 30, 2017

(54) DISPLAY DEVICE WITH REDUCED MANUFACTURING COST AND METHOD OF MANUFACTURING THE SAME

(71) Applicant: SAMSUNG DISPLAY CO., LTD., Yongin-si, Gyeonggi-do (KR)

(72) Inventors: Jaeho Choi, Asan-si (KR); Bonyong Koo, Asan-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 15/040,243

(22) Filed: Feb. 10, 2016

(65) Prior Publication Data

US 2016/0334679 A1 Nov. 17, 2016

(30) Foreign Application Priority Data

May 12, 2015 (KR) .......................... 10-2015-0066094

(51) Int. Cl.
| | |
|---|---|
| *H01L 27/12* | (2006.01) |
| *G02F 1/1343* | (2006.01) |
| *G02F 1/1368* | (2006.01) |
| *G02F 1/1362* | (2006.01) |
| *G02F 1/1333* | (2006.01) |

(52) U.S. Cl.
CPC ...... *G02F 1/134309* (2013.01); *G02F 1/1368* (2013.01); *G02F 1/13439* (2013.01); *G02F 1/133345* (2013.01); *G02F 1/136286* (2013.01); *H01L 27/124* (2013.01); *G02F 2001/134318* (2013.01); *G02F 2001/136295* (2013.01)

(58) Field of Classification Search
CPC ......... G02F 1/134309; G02F 1/136286; G02F 1/1368; G02F 1/133345; G02F 1/13439; G02F 2001/136295; G02F 2001/134318; H01L 27/124
See application file for complete search history.

(56) References Cited

U.S. PATENT DOCUMENTS

| | | | |
|---|---|---|---|
| 2008/0124825 A1 | 5/2008 | Hashimoto et al. | |
| 2010/0225569 A1 | 9/2010 | Park et al. | |
| 2013/0313556 A1 | 11/2013 | Kim et al. | |
| 2014/0183536 A1* | 7/2014 | Park | H01L 27/124 |
| | | | 257/59 |

FOREIGN PATENT DOCUMENTS

| | | |
|---|---|---|
| JP | 2002-328395 | 11/2002 |
| KR | 1020080050711 | 6/2008 |
| KR | 1020130131701 | 12/2013 |

* cited by examiner

*Primary Examiner* — Roy Potter
*Assistant Examiner* — Paul Patton
(74) *Attorney, Agent, or Firm* — F. Chau & Associates, LLC

(57) ABSTRACT

A display device includes a gate line and a data line on a first substrate. A first passivation layer disposed thereon has a first contact hole. A second passivation layer on the first passivation layer has a second contact hole. A common electrode is disposed on the second passivation layer and a residual pattern is disposed on a drain electrode. A third passivation layer, having a third contact hole, is disposed on the common electrode. A pixel electrode, connected to the drain electrode, is disposed on the third passivation layer. A groove is defined between the first and second passivation layers. The common electrode has a open circuit from the residual pattern thereof.

20 Claims, 7 Drawing Sheets

DISPLAY DEVICE WITH REDUCED MANUFACTURING COST AND METHOD OF MANUFACTURING THE SAME

CROSS-REFERENCE TO RELATED APPLICATION

This application claims the priority under 35 U.S.C. §119 to Korean Patent Application No. 10-2015-0066094, filed on May 12, 2015, with the Korean Intellectual Property Office (KIPO), the disclosure of which is incorporated by reference herein in its entirety.

TECHNICAL FIELD

Embodiments of the present invention relate to a display device, and more particularly, to a display device having a reduced manufacturing cost and a method of manufacturing the display device.

DISCUSSION OF THE RELATED ART

Flat panel display ("FPD") devices are a type of display device which tent to have a narrow profile. FPD devices may include liquid crystal display (LCD) devices, organic light emitting diode (OLED) display devices, plasma display panel (PDP) devices, electrophoretic display (EPD) devices, electro-wetting display device, and the like.

The LCD device includes a pair of display substrates on which electric-field generating electrodes, such as a pixel electrode and a common electrode, are formed and a liquid crystal layer interposed between the pair of substrates. Upon applying voltage to the electric-field generating electrodes, an electric field is generated over the liquid crystal layer, such that orientation of liquid crystal molecules of the liquid crystal layer is determined and polarization of incident light is controlled to thereby display an image.

In the LCD device, both of the two electric-field generating electrodes, that generate an electric-field over the liquid crystal layer, may be formed on a single thin film transistor display panel.

When the two electric-field generating electrodes are formed on the single thin film transistor display panel, a plurality of insulating layers are disposed between the thin film transistor and the electric-field generating electrode, and at least one layer of the plurality of insulating layers may use an organic insulating layer. A contact hole may be formed in the plurality of insulating layers so as to electrically connect the thin film transistor and the electric-field generating electrode.

SUMMARY

Aspects of exemplary embodiments of the present invention are directed to a liquid crystal display ("LCD") device capable of reducing manufacturing costs by decreasing the number of manufacturing processes, and to a method of manufacturing the LCD device.

According to one exemplary embodiment of the present invention, a display device includes a first substrate. A gate line and a data line are disposed on the first substrate. A first passivation layer is disposed on the gate line and the data line. The first passivation layer has a first contact hole. A second passivation layer is disposed on the first passivation layer. The second passivation layer has a second contact hole, a common electrode, and a residual pattern of the common electrode. The common electrode is disposed on the second passivation layer and the residual pattern is disposed on a drain electrode. A third passivation layer is disposed on the common electrode. The third passivation layer has a third contact hole. A pixel electrode is disposed on the third passivation layer. The pixel electrode is connected to the drain electrode. A groove is defined between the first passivation layer and the second passivation layer. The residual pattern of the common electrode causes an open circuit in the common electroded.

The groove may be larger in the second passivation layer than in the first passivation layer.

The display device may further include a thin film transistor connected to the gate line and the data line.

The pixel electrode may be connected to the thin film transistor.

The pixel electrode may have a plurality of cut-out portions, and the common electrode may have a planar shape.

The display device may further include a second substrate facing the first substrate.

According to one exemplary embodiment of the present invention, a method of manufacturing a display device includes forming a gate line and a data line on a first substrate. A first passivation layer is formed on the gate line and the data line. A second passivation layer is formed on the first passivation layer. The first passivation layer and the second passivation layer are etched to thereby define a groove between the first passivation layer and the second passivation layer. A common electrode is coated over an entire surface of the first substrate.

The forming of the first passivation layer may include forming a plurality of thin film layers deposited under different temperature and pressure conditions.

The forming of the first passivation layer may further include depositing a thin film layer in a final step under a higher pressure than is used to deposit a thin film layer in a previous step.

By forming the various thin film layers at different pressures and temperatures, the thin film layers may have different densities and may therefor etch at different rates when exposed to identical etching conditions.

The method may further include forming a third passivation layer on the common electrode.

The groove may be defined through a dry-etching method.

The method may further include forming a pixel electrode on the third passivation layer.

The method may further include forming a thin film transistor connected to the gate line and the data line.

The pixel electrode may have a plurality of cut-out portions, and the common electrode may have a planar shape.

The method may further include forming a second substrate facing the first substrate.

BRIEF DESCRIPTION OF THE DRAWINGS

The above and other features and aspects of the present disclosure will be more clearly understood from the following detailed description taken in conjunction with the accompanying drawings, in which.

DETAILED DESCRIPTION

Figure 1:
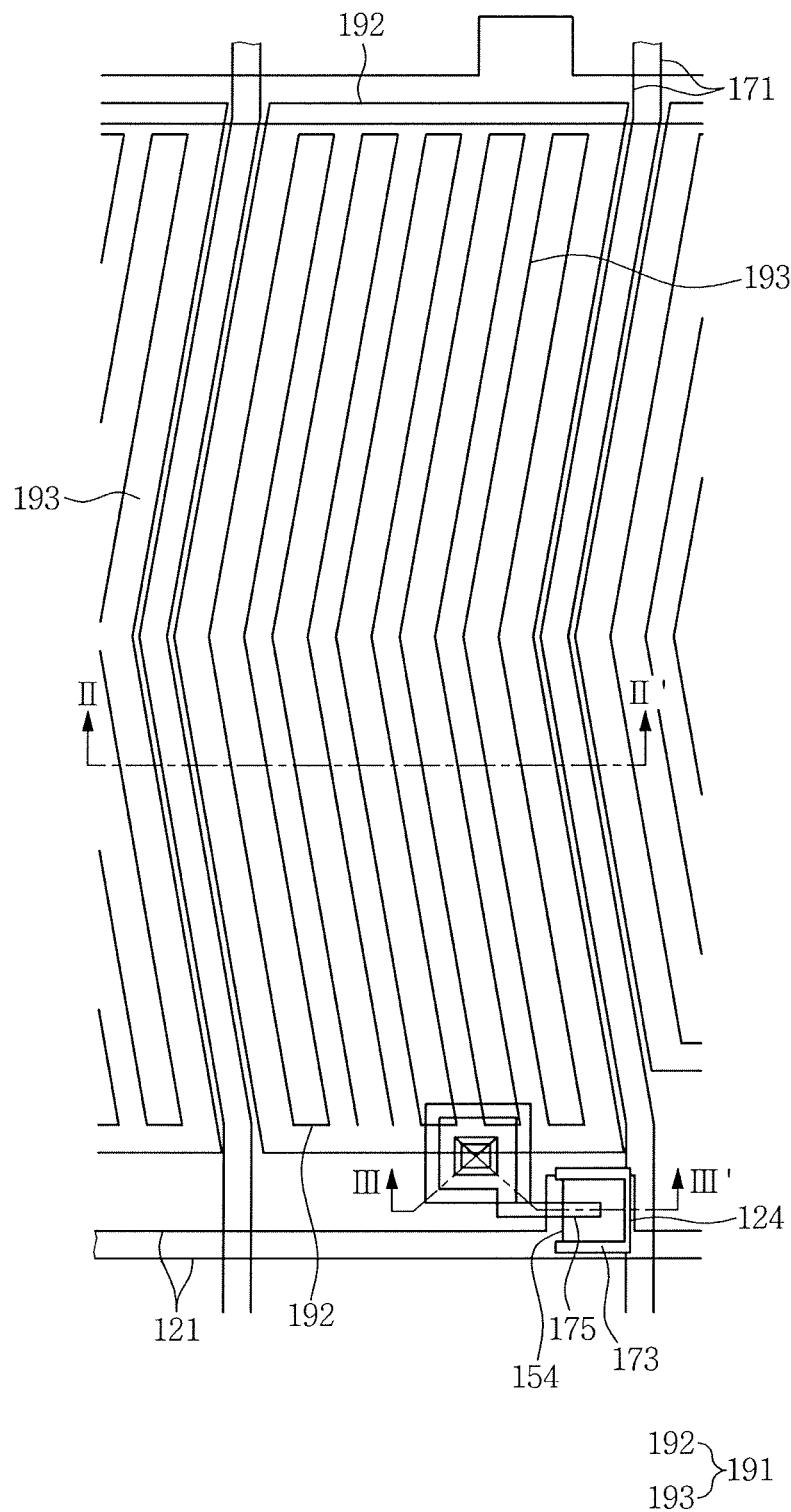
FIG. 1 is a plan view illustrating a display device according to an exemplary embodiment of the present invention.

Aspects and features of the present invention and methods for achieving them will be made clear from exemplary embodiments described below in detail with reference to the accompanying drawings. The present invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. Like reference numerals may refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

FIG. 1 is a plan view illustrating a display device according to an exemplary embodiment of the present invention.

Figure 2:
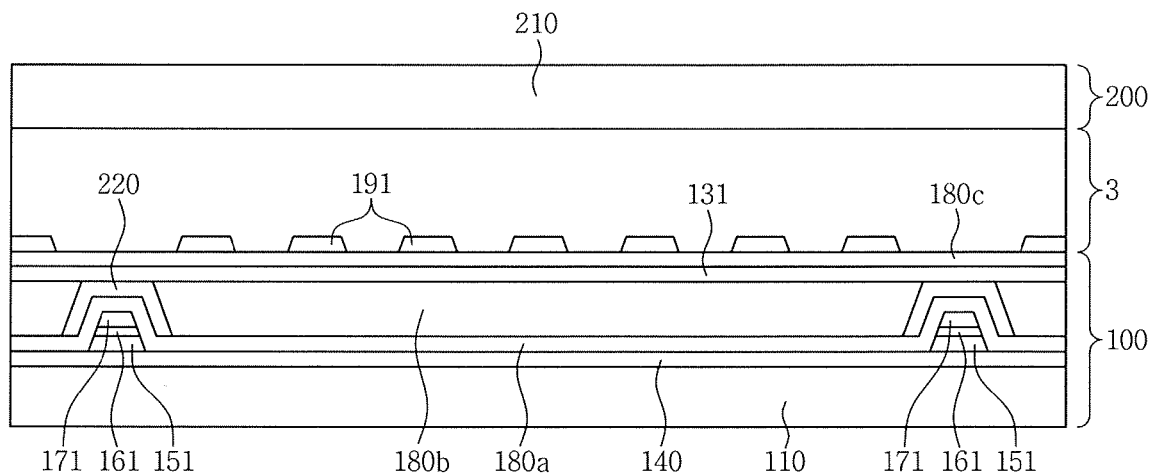
FIG. 2 is a cross-sectional view illustrating the display device of FIG. 1 taken along line II-II'.
Figure 3:
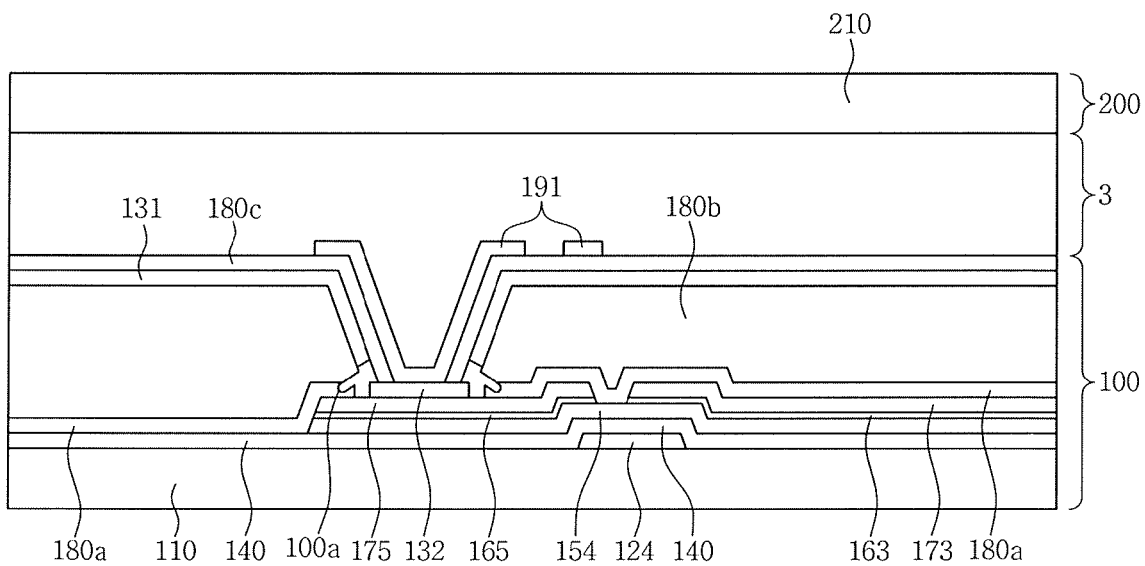
FIG. 3 is a cross-sectional view illustrating a thin film transistor display panel of FIG. 1 taken along line III-III'.

With reference to FIGS. 1 to 3, a plurality of gate lines 121 are disposed on a first substrate 110.

Each of the plurality of gate lines 121 includes a plurality of gate electrodes 124 protruding downwards and a gate pad unit. A gate driving circuit (not illustrated) generating gate signals may be embedded in a flexible printed circuit film (not illustrated) which is attached to the first substrate 110, or may be directly embedded on the first substrate 110.

The gate line 121 may be formed of aluminum (Al) or alloys thereof, silver (Ag) or alloys thereof, copper (Cu) or alloys thereof, molybdenum (Mo) or alloys thereof, chromium (Cr), tantalum (Ta), and/or titanium (Ti). Further, the gate line 121 may have a monolayer structure or may have a multi-layer structure including at least two conductive layers.

A gate insulating layer 140 is formed on the gate line 121. The gate insulating layer 140 may be formed of an inorganic insulating material such as silicon nitride ($SiN_x$) or silicon oxide ($SiO_x$).

A plurality of semiconductors 151 are formed on the gate insulating layer 140. Each semiconductor 151 includes a protruding portion 154 extending toward the gate electrode 124. The semiconductor 151 may include amorphous silicon, polysilicon, an oxide semiconductor, and/or the like.

The semiconductor 151 includes an end portion disposed below a data pad unit.

A plurality of ohmic contact members 161, 163, and 165 are disposed on the semiconductor 151. Two of the ohmic contact members 163 and 165 are disposed in a pair on the protruding portion 154 of the semiconductor 151, facing each other with respect to the gate electrode 124. Another ohmic contact member may be disposed below the data pad unit to be described further below.

The ohmic contact members 161, 163, and 165 may be formed of silicide or n+ hydrogenated amorphous silicon doped with n-type impurities, such as phosphorus, at high concentration. However, the ohmic contact members 161, 163, and 165 may be omitted. For example, when the semiconductor 151 is silicon oxide, the ohmic contact members 161, 163, and 165 may be omitted.

A data conductor including a plurality of data lines 171 and a plurality of drain electrodes 175 is disposed on the ohmic contact members 161, 163, and 165.

The data line 171 transmits data signals, and extends in a longitudinal direction to intersect the gate line 121. Each of the data lines 171 includes a plurality of source electrodes 173 extending toward the gate electrode 124 and the data pad unit provided for connection with another layer or an external driving circuit. A data driving circuit (not illustrated) generating data signals may be embedded in a flexible printed circuit film (not illustrated) attached to the first substrate 110 or may be directly embedded on the first substrate 110.

The data line 171 may have periodic bends, and may form an oblique angle with respect to an extending direction of the gate line 121. The oblique angle formed between the data line 171 and the extending direction of the gate line 121 may be about 45 degrees or more. However, the data line 171 may alternatively extend into a straight line.

The data conductor, which includes the data line 171 and the drain electrode 175, may have a monolayer structure, or may have a multi-layer structure including two or more conductive layers.

The drain electrode 175 may have a bar-shape end portion that faces the source electrode 173 with respect to the gate electrode 124 and the other end portion may be larger than the bar-shaped end portion.

The gate electrode 124, the source electrode 173, and the drain electrode 175, along with the protruding portion 154 of the semiconductor 151, constitute a thin film transistor (TFT) which is a switching element. The semiconductor 151, except for the protruding portion 154 of the semiconductor 151 on which the thin film transistor is disposed, may have substantially the same planar shape as the data line 171, the drain electrode 175, and the ohmic contact members 161 and 165 therebelow.

The data line 171 and the drain electrode 175 may be made of, in particular, a refractory metal, such as Mo, Cr, Ta, and Ti, or a metal alloy thereof, and may have a multi-layer structure including a refractory metal layer (not illustrated) and a low-resistance conductive layer (not illustrated). Examples of the multi-layer structure may include a doublelayer structure including a Cr or Mo (alloy) lower film and an Al (alloy) upper film, and a triple-layer structure including a Mo (alloy) lower film, an Al (alloy) intermediate film, and a Mo (alloy) upper film. In some exemplary embodiments of the present invention, the data line 171 and the drain electrode 175 may be formed of various metals or conductive materials other than the aforementioned materials.

A first passivation layer 180a is disposed on the data line 171, the drain electrode 175, and the exposed protruding portion 154 of the semiconductor 151. The first passivation layer 180a may be formed of an inorganic insulating material, such as silicon nitride ($SiN_x$) or silicon oxide ($SiO_x$).

Figure 4:
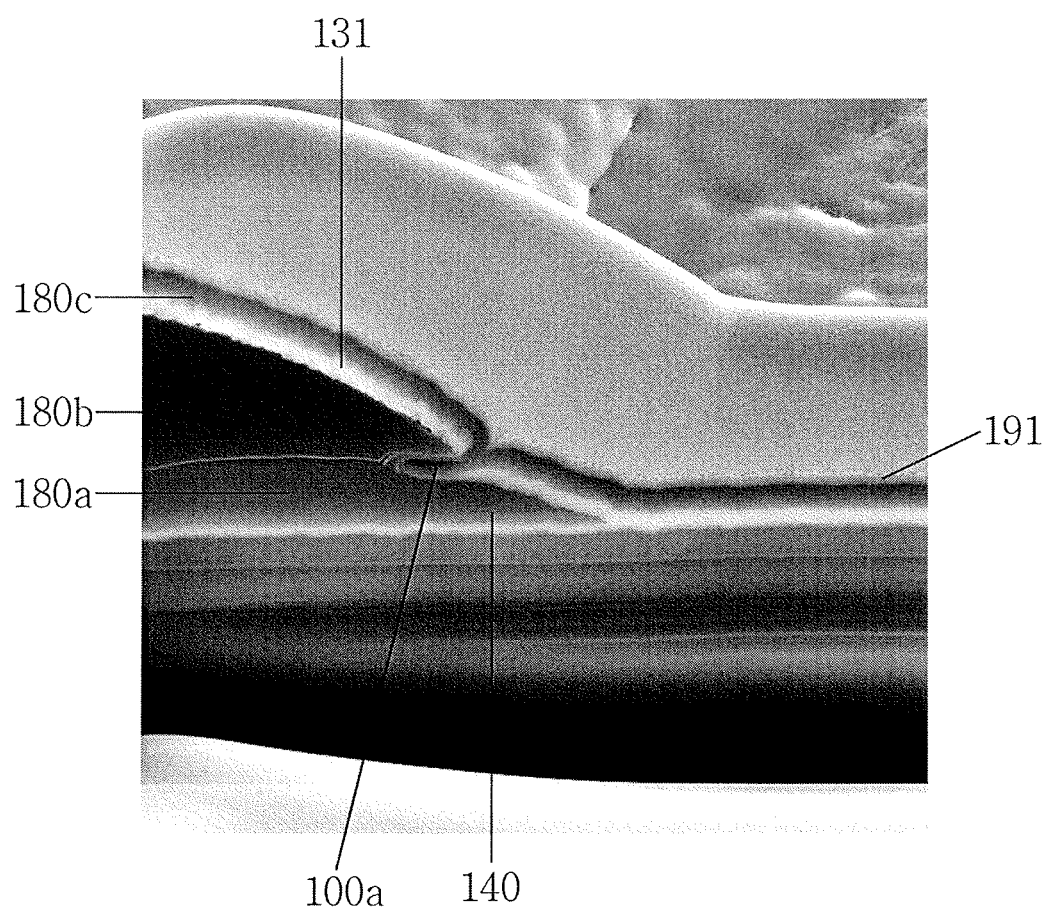
FIG. 4 is a partial enlarged view illustrating a groove of FIG. 3.

With reference to FIGS. 1 and 4, the first passivation layer 180a may have a first contact hole (not illustrated). In the first contact hole, the gate pad unit, the data pad unit, and the drain electrode 175 are connected to the gate line 121, the data line 171, and the pixel electrode 191, respectively. Further, a groove 100a is defined between the first passivation layer 180a and a second passivation layer 180b.

According to exemplary embodiments of the present invention, the groove 100a may be etched to a greater extent in the first passivation layer 180a than the groove 100a is etched in the second passivation layer 180b.

With reference to FIG. 2, a light shielding member 220 may be disposed on the first passivation layer 180a. However, the position of the light shielding member 220 is not limited thereto.

Further, a second passivation layer 180b is disposed on the first passivation layer 180a and the light shielding member 220. The second passivation layer 180b may be formed of an inorganic insulating layer or an organic insulating layer, and a surface of the second passivation layer 180b may be substantially flat. The second passivation layer 180b includes a photosensitive material and a non-photosensitive material.

Further, the second passivation layer 180b has a second contact hole (not illustrated) corresponding to the first contact hole. Accordingly, the gate pad unit, the data pad unit, and the drain electrode 175 are connected to the gate line 121, the data line 171, and the pixel electrode 191, respectively, through the first contact hole and the second contact hole.

A common electrode 131 is formed on the second passivation layer 180b. The common electrode 131 may be formed of a transparent conductive material such as indium tin oxide ("ITO") or indium zinc oxide ("IZO"), and may have a planar shape. The common electrode 131 may be disposed over an entire surface of the first substrate 110, e.g. the common electrode 131 may cover the whole panel. The common electrode 131 is connected to a common voltage line disposed in a peripheral portion around a display area, to thereby receive a common voltage.

A residual pattern 132 of the common electrode 131 is disposed on the drain electrode 175. The residual pattern 132 of the common electrode 131 has an open circuit as a result of the common electrode 131, and may not be electrically connected to the common voltage line.

The residual pattern 132 of the common electrode 131 may be formed of the same material as the common electrode 131.

A third passivation layer 180c is disposed on the common electrode 131. The third passivation layer 180c may be formed of an inorganic insulating material such as silicon nitride ($SiN_x$) or silicon oxide ($SiO_x$).

The third passivation layer 180c has a third contact hole (not illustrated) corresponding to the first contact hole and the second contact hole. Accordingly, the gate pad unit, the data pad unit, and the drain electrode 175 are connected to the gate line 121, the data line 171, and the pixel electrode 191, respectively, through the first contact hole, the second contact hole, and the third contact hole. The pixel electrode 191 is disposed on the third passivation layer 180c, and the pixel electrode 191 may be formed of a transparent conductive material such as ITO or IZO.

The pixel electrode 191 includes a plurality of branch electrodes 193 extending primarily parallel to and spaced apart from each other and lower and upper transverse portions 192 which connect upper end portions of the branch electrodes 193 and lower end portions of the branch electrodes 193, respectively. The branch electrode 193 of the pixel electrode 191 may be bent along the data line 171.

A protruding portion of the pixel electrode 191 is electrically connected to the drain electrode 175 and the residual pattern 132 of the common electrode 131 through the first contact hole, the second contact hole, and the third contact hole in the first passivation layer 180a, the second passivation layer 180b, and the third passivation layer 180c, to thereby receive a voltage from the drain electrode 175.

The first contact hole, the second contact hole, and the third contact hole are formed in the first passivation layer 180a, the second passivation layer 180b, and the third passivation layer 180c, respectively. The planar shapes of the first contact hole, the second contact hole, and the third contact hole may each be polygonal, for example a quadrangular shape, or may be circular or elliptical. In some exemplary embodiments of the present invention, a connecting member may be formed in the first contact hole, the second contact hole, and the third contact hole.

Although not illustrated, an alignment layer is coated on the pixel electrode 191 and the third passivation layer 180c. The alignment layer may be a homeotropic alignment layer and may be rubbed in a predetermined direction. The alignment layer may include a photo-reactive material, and may be photo-aligned.

A liquid crystal layer 3 is disposed between a first panel 100 including the first substrate 110 and a second panel 200 including a second substrate 210.

The liquid crystal layer 3 includes a nematic liquid crystal material having a positive dielectric anisotropy. The nematic liquid crystal molecules of the liquid crystal layer 3 may have a major axis that is parallel to both the first substrate 110 and the second substrate 210.

The pixel electrode 191 and the common electrode 131, which are electric-field generating electrodes, may generate an electric field, and thereby liquid crystal molecules of the liquid crystal layer 3 on the pixel electrode 191 and the common electrode 131 may rotate in a direction parallel to the direction of the electric field. In accordance with the rotating direction of the liquid crystal molecules, which is determined in the above described manner, polarization of light passing through the liquid crystal layer 3 may vary.

The second substrate 210 may be formed of a transparent material such as glass or plastic.

A plurality of color filters may be disposed on the second substrate 210. Each of the color filters may be red, green, or blue in color, or may be of another color.

Hereinafter, with reference to FIGS. 5 to 14, a method of manufacturing a first substrate 110 according to an exemplary embodiment of the present invention will be described. However, reference will also be made to elements that are illustrated in other figures.

FIGS. 5 to 14 are cross-sectional views illustrating a method of manufacturing the first substrate 110 according to an exemplary embodiment of the present invention.

Figure 5:
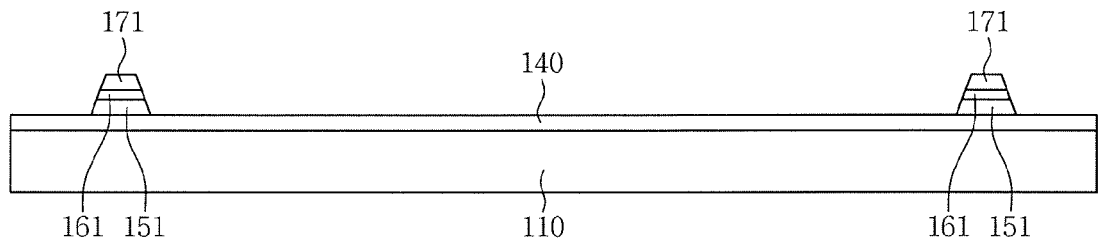
FIGS. 5 to 14 are cross-sectional views illustrating a method of manufacturing the display device according to an exemplary embodiment of the present invention.
Figure 6:
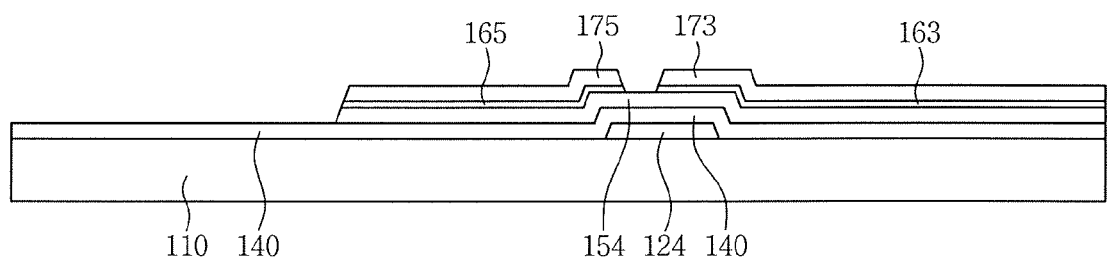

With reference to FIGS. 5 and 6, a gate line 121 including a gate electrode 124 and a gate pad unit is formed on the first substrate 110. A common voltage line disposed in a peripheral portion thereof may also be formed. Subsequently, a gate insulating layer 140 is deposited on the gate line 121 and the common voltage line. A semiconductor 151 is deposited thereon, and a layer constituting an ohmic contact member is formed over that.

A source electrode 173, a data line 171 including a data pad unit, and a drain electrode 175 are deposited on the ohmic contact member to thereby form a data conductor.

Subsequently, a layer constituting the ohmic contact member is etched, using the data conductor as a mask, such that ohmic contact members 161, 163, and 165 are formed and a portion of a protruding portion 154 of the semiconductor 151 is exposed. The gate insulating layer 140 may be formed of an inorganic insulating material such as silicon nitride ($SiN_x$) or silicon oxide ($SiO_x$).

Figure 7:
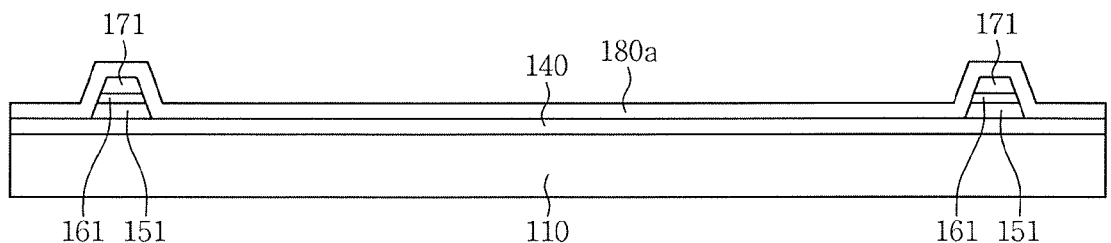

Subsequently, with reference to FIG. 7, a first passivation layer 180a is deposited on the data conductor including the data line 171 and the drain electrode 175. The first passivation layer 180a may be formed of an inorganic insulating material such as silicon nitride ($SiN_x$) or silicon oxide ($SiO_x$).

In the process of depositing the first passivation layer 180a, a plasma enhanced chemical vapor deposition (PECVD) device may be used.

According to an exemplary embodiment of the present invention, in order to form the first passivation layer 180a, silicon nitride (SiN) layers may be deposited through a number of processes in a PECVD method.

The first passivation layer 180a may be formed by depositing a silicon oxide layer, a silicon nitride layer, and a silicon nitric-oxide layer through the PECVD method into a monolayer or multi-layer structure. Further, a silicon oxide layer or a silicon nitric-oxide layer and a silicon nitride layer or a silicon nitric-oxide layer may be sequentially deposited from a substrate to form the first passivation layer 180a. Further, a silicon nitride layer or a silicon nitric-oxide layer, a silicon nitride layer or a silicon nitric-oxide layer, and a silicon nitride layer or a silicon nitric-oxide layer may be sequentially deposited from the substrate to form the first passivation layer 180a.

According to an exemplary embodiment of the present invention, the layers are deposited into a multi-layer structure under different temperature and pressure conditions to form the first passivation layer 180a. Accordingly, the first passivation layer 180a includes a plurality of thin film layers having different etching speeds.

For example, in a first step, a thin film layer is deposited at a pressure of 1800 mTorr and a power consumption of about 4.3 Kw. In a second step, a thin film layer is deposited on the thin film layer formed through the first step at a pressure of 1300 mTorr and a power consumption of about 6.1 Kw. In a third step, a thin film layer is deposited on the thin film layer formed through the second step at a pressure of 1500 mTorr and a power consumption of about 6.1 Kw. In a fourth step, a thin film layer is deposited on the thin film layer formed through the third step at a pressure of 1700 mTorr and a power consumption of about 6.1 Kw.

Accordingly, in the fourth step, the thin film layer is deposited under a higher pressure than in the third step and at the same power consumption.

When the deposition process is performed in such a manner, the thin film layer deposited in the final step may have an etching speed that is higher than an etching speed of the thin film layer deposited in the previous step.

Figure 8:
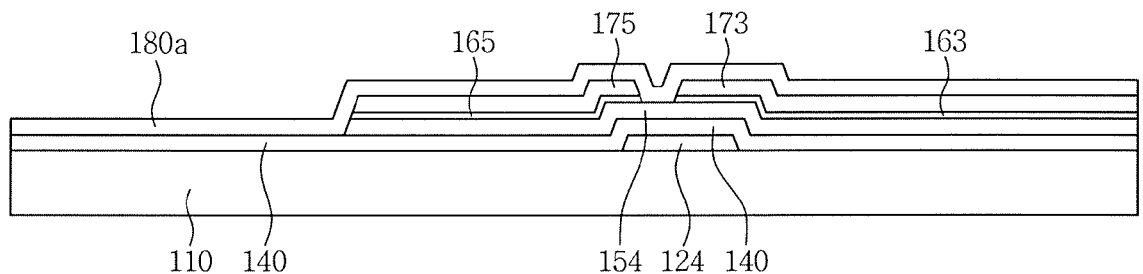
Figure 9:
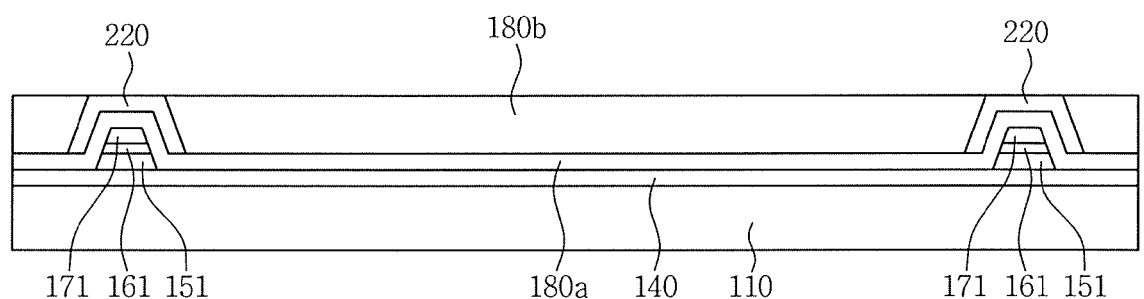

FIG. 8 illustrates the view of FIG. 6 with the first passivation layer 180a disposed thereon. FIG. 9 illustrates the view of FIG. 7 with the addition of the light shielding member 220 and the second passivation layer 180b disposed thereon.

Figure 10:
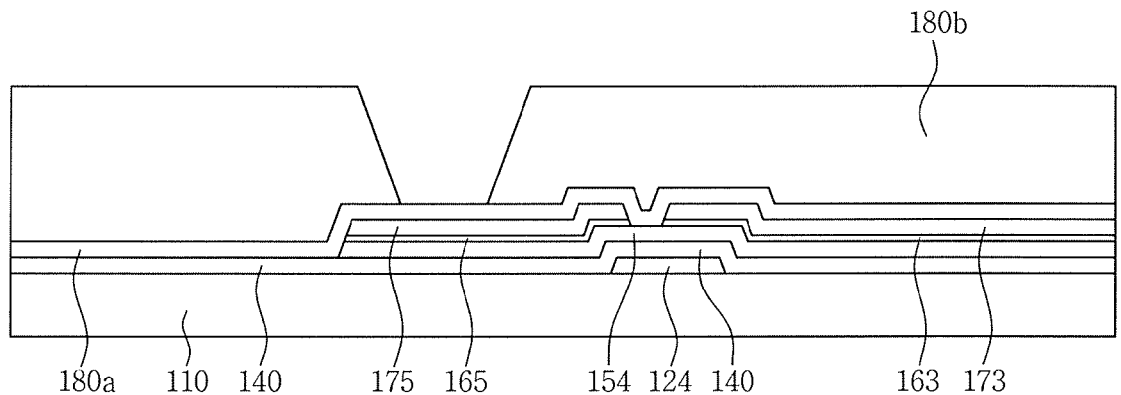

Subsequently, with reference to FIG. 10, the second passivation layer 180b is deposited on the first passivation layer 180a.

According to an exemplary embodiment of the present invention, the second passivation layer 180b is an organic insulating layer and includes a photosensitive material and a non-photosensitive material. However, the second passivation layer 180b is not limited to the organic insulating layer.

The first passivation layer 180a and the second passivation layer 180b have a first contact hole (not illustrated) and a second contact hole (not illustrated), respectively, in an area corresponding to a peripheral portion of the drain electrode 175.

Figure 11:
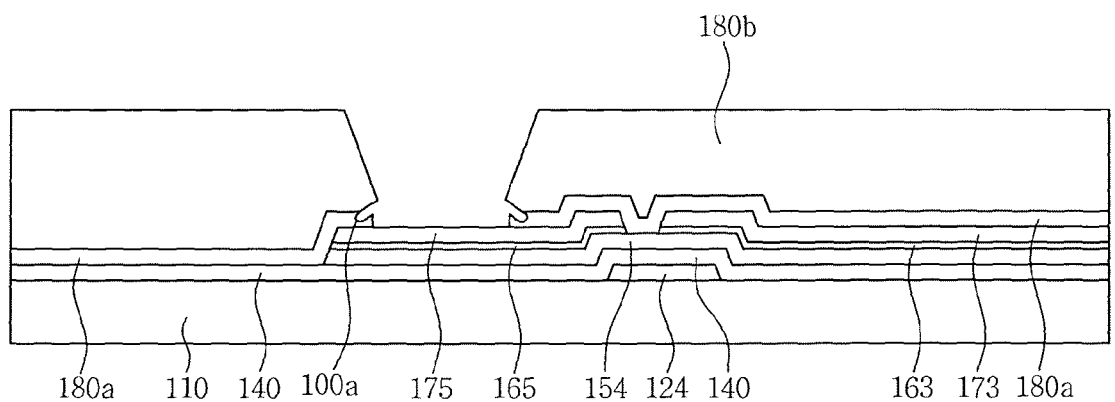

With reference to FIG. 11, the first passivation layer 180a and the second passivation layer 180b are etched in the first contact hole and the second contact hole. In this case, the first passivation layer 180a and the second passivation layer 180b may be etched according to any known method for etching, and for example, a dry-etching method may be employed.

Through the etching, a groove 100a is defined between the first passivation layer 180a and the second passivation layer 180b. According to the exemplary embodiment, the groove 100a is etched further in the second passivation layer 180b than in the first passivation layer 180a.

Figure 12:
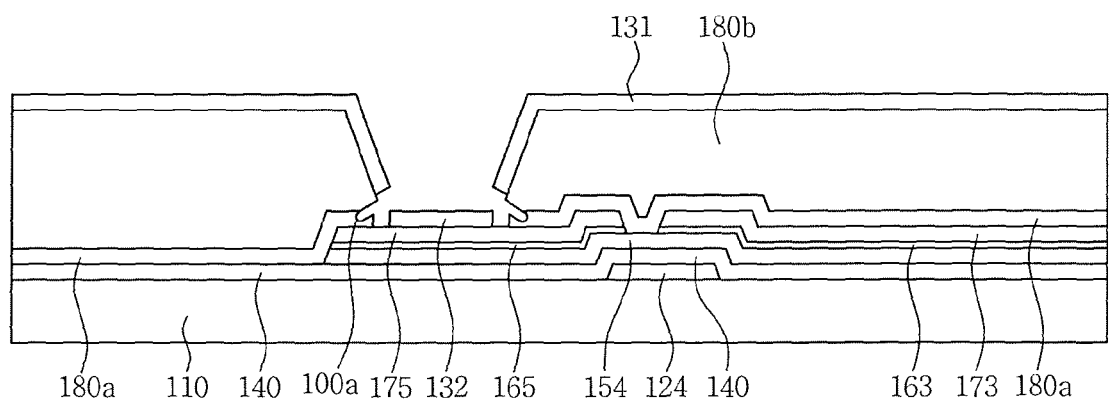

With reference to FIG. 12, the common electrode 131 is coated over an entire surface of the first substrate 110. In this case, the common electrode 131 has an open circuit from the groove 100a. For example, a residual pattern 132 of the common electrode 131 is formed on the drain electrode 175, the residual pattern 132 has an open circuit from the common electrode 131.

According to the exemplary embodiment, the common electrode 131 on the first substrate 110 may have a planar shape.

Figure 13:
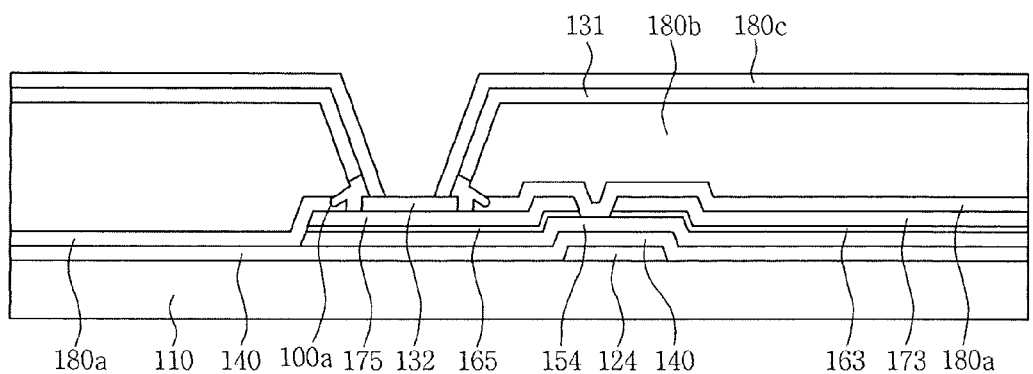
Figure 14:
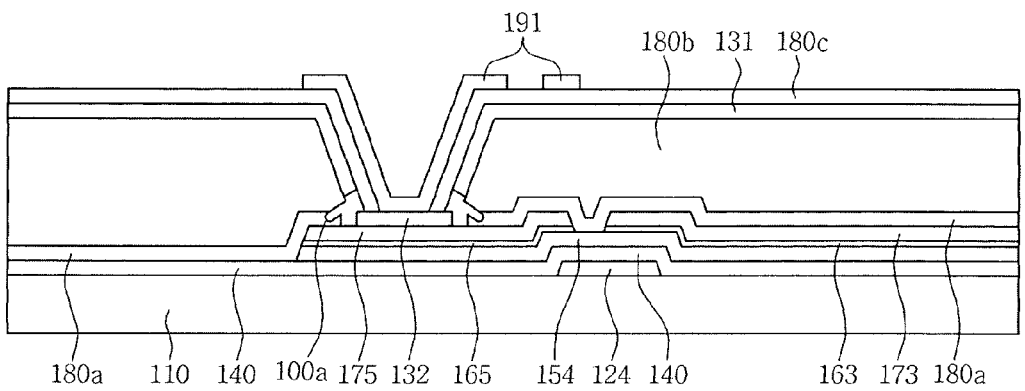

Subsequently, with reference to FIG. 13, a third passivation layer 180c is formed on the common electrode 131. In this case, the third passivation layer 180c is etched to thereby form a third contact hole (not illustrated) corresponding to the first contact hole and the second contact hole.

As illustrated in FIGS. 1, 2, 3, and 14, a pixel electrode 191 is formed on the third passivation layer 180c.

In order to form the pixel electrode 191, which includes a plurality of branch electrodes, after a pixel-electrode-forming material is coated over an entire surface of the third passivation layer 180c, the pixel-electrode-forming material is selectively removed to form a plurality of cut-out portions.

Further, the pixel electrode 191 is connected to the residual pattern 132 of the common electrode 131 on the drain electrode 175. Accordingly, the pixel electrode 191 covers the drain electrode 175 exposed through the first contact hole, the second contact hole, and the third contact hole, so as to be electrically connected to the drain electrode 175.

Subsequently, liquid crystals 310 are interposed between the first substrate 110 and the second substrate 210, and the first substrate 110 and the second substrate 210 are adhered to each other to thereby form the LCD device illustrated in FIG. 2.

The second substrate 210 is formed of a transparent material such as glass or one or more plastics.

A plurality of color filters may be disposed on the second substrate 210. Each of the color filters may be red, green, or blue, or other colors.

As set forth above, according to exemplary embodiments of the present invention, manufacturing costs of a display device may be reduced by decreasing the number of manufacturing processes. In addition, a common electrode is disposed over an entire area, aside from a first contact hole, a second contact hole, and a third contact hole, in the display device, and thus the display device may be capable of preventing electrical defects.

From the foregoing, it will be appreciated that various exemplary embodiments in accordance with the present disclosure have been described herein for purposes of illustration, and that various modifications may be made without departing from the scope and spirit of the invention. Various features of the above described and other exemplary embodiments can be mixed and matched in any manner, to produce further exemplary embodiments consistent with the invention.

What is claimed is:

1. A display device comprising:
   a first substrate;
   a gate line and a data line disposed on the first substrate;
   a first passivation layer disposed on both the gate line and the data line, the first passivation layer having a first contact hole;
   a second passivation layer disposed on the first passivation layer, the second passivation layer having a second contact hole;
   a common electrode disposed on the second passivation layer;
   a residual pattern of the common electrode disposed on a drain electrode; and
   a pixel electrode disposed on the second passivation layer, the pixel electrode being connected to the drain electrode,
   a groove is disposed within the first passivation layer and within the second passivation layer, and
   wherein the common electrode is isolated from the residual pattern of the common electrode by the groove and the residual pattern is in direct contact with the drain electrode.

2. The display device of claim 1, wherein the groove is larger in the second passivation layer than in the first passivation layer.

3. The display device of claim 2, further comprising a thin film transistor connected to both the gate line and the data line.

4. The display device of claim 3, wherein the pixel electrode is connected to the thin film transistor.

5. The display device of claim 4, wherein the pixel electrode has a plurality of cut-out portions, and the common electrode has a planar shape.

6. The display device of claim 5, further comprising a second substrate aligned with the first substrate.

7. A method of manufacturing a display device, the method comprising:
   forming a gate line and a data line on a first substrate;
   forming a first passivation layer on the gate line or the data line;
   forming a second passivation layer on the first passivation layer;
   etching the first passivation layer and the second passivation layer to thereby dispose a groove within the first passivation layer and within the second passivation layer; and
   forming a common electrode and a residual pattern of the common electrode, which is isolated from the common electrode by the groove, over an entire surface of the first substrate.

8. The method of claim 7, wherein the forming of the first passivation layer comprises forming a plurality of thin film layers each deposited under different temperature and pressure conditions.

9. The method of claim 8, wherein the forming of the first passivation layer further comprises depositing a thin film layer at a higher pressure in a final step than in a previous step.

10. The method of claim 9, further comprising forming a third passivation layer on the common electrode.

11. The method of claim 10, wherein the groove is generated using a dry-etching method.

12. The method of claim 11, further comprising forming a pixel electrode on the third passivation layer.

13. The method of claim 12, further comprising forming a thin film transistor connected to both the gate line and the data line.

14. The method of claim 13, wherein the pixel electrode has a plurality of cut-out portions, and the common electrode has a planar shape.

15. The method of claim 14, further comprising forming a second substrate aligned with the first substrate.

16. A display device, comprising:
    a first substrate;
    a gate line and a data line disposed on the first substrate;
    a first passivation layer comprising a first thin film layer having a first density and at least one second thin film layer having a second density different from the first density, the first passivation layer disposed on the gate line or the data line, the first passivation layer having a first contact hole;
    a second passivation layer disposed on the first passivation layer, the second passivation layer having a second contact hole;
    a common electrode disposed on the second passivation layer; and
    a pixel electrode disposed on the common electrode, the pixel electrode connected to the drain electrode,
    a groove is disposed within the first passivation layer and within the second passivation layer.

17. The display device of claim 16, wherein the groove is larger in the second passivation layer than in the first passivation layer.

18. The display device of claim 16, further comprising a thin film transistor connected to both the gate line and the data line.

19. The display device of claim 16, further comprising a pixel electrode, having a plurality of cut-out portions, connected to a thin film transistor.

20. The display device of claim 16, wherein the common electrode has a planar shape.

* * * * *